(12) United States Patent
Mtchedlishvili et al.

(10) Patent No.: US 8,375,571 B2
(45) Date of Patent: Feb. 19, 2013

(54) COMPONENT ASSEMBLY FOR SURFACE MOUNTING

(75) Inventors: George Mtchedlishvili, Hallendale, FL (US); Joseph Q. Combey, Coral Springs, FL (US); Anthony M. Kakiel, Coral Springs, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1185 days.

(21) Appl. No.: 12/234,942

(22) Filed: Sep. 22, 2008

(65) Prior Publication Data

US 2010/0075534 A1 Mar. 25, 2010

(51) Int. Cl.
*B23P 19/00* (2006.01)
(52) U.S. Cl. ............... 29/743; 29/747; 29/760; 439/581
(58) Field of Classification Search .................. 361/825; 439/63, 581, 675; 29/832, 837, 874, 876, 29/743, 744, 747, 760
See application file for complete search history.

(56) References Cited

U.S. PATENT DOCUMENTS

| | | | | |
|---|---|---|---|---|
| 5,088,937 A | * | 2/1992 | Gabany | 439/581 |
| 5,272,597 A | * | 12/1993 | Staples et al. | 361/825 |
| 5,645,454 A | * | 7/1997 | Kosmala | 439/63 |

* cited by examiner

*Primary Examiner* — Donghai D. Nguyen
(74) *Attorney, Agent, or Firm* — Barbara R. Doutre

(57) ABSTRACT

A component assembly (10) used for picking and placing the component assembly includes a component (14-30) having a geometry incapable of being picked and placed or having a geometry that is unstable when placed through a reflow oven. The assembly includes a support member such as a detachable clip (11) having a pick and placeable surface such as a top flat surface (12). The clip attaches to the component to modify a center of gravity to form a stable component assembly once attached to the support member. The component assembly can further include conductive elements (such as a center conductor (17) of a coaxial cable (16) and at least one ground conductor (15)) used for registration with apertures or other surface locations on a substrate (19).

10 Claims, 4 Drawing Sheets

70

```
┌─────────────────────────────────────────────┐ ╱─72
│ ADD CLIP OR SUPPORT MEMBER WITH A PICK AND  │
│ PLACEABLE SURFACE TO A UNBALANCED OR COMPLEX│
│ COMPONENT TO FORM AN ASSEMBLY, SHIFT THE    │
│ CENTER OF GRAVITY OF THE ASSEMBLY AND       │
│ STABILIZE THE ASSEMBLY DURING REFLOW        │
└─────────────────────────────────────────────┘
                     ↓
┌ ─ ─ ─ ─ ─ ─ ─ ─ ─ ─ ─ ─ ─ ─ ─ ─ ─ ─ ─ ─ ─ ┐ ╱─73
    PLACE THE ASSEMBLY ON A TAPE REEL
└ ─ ─ ─ ─ ─ ─ ─ ─ ─ ─ ─ ─ ─ ─ ─ ─ ─ ─ ─ ─ ─ ┘
                     ↓
┌─────────────────────────────────────────────┐ ╱─74
│   PICK THE ASSEMBLY USING THE PICK AND      │
│        PLACEABLE SURFACE OF THE CLIP        │
└─────────────────────────────────────────────┘
                     ↓
┌─────────────────────────────────────────────┐ ╱─75
│  PLACE THE ASSEMBLY ON A SUBSTRATE SUCH AS  │
│           A PRINTED CIRCUIT BOARD           │
└─────────────────────────────────────────────┘
                     ↓
┌─────────────────────────────────────────────┐ ╱─76
│             REFLOW THE ASSEMBLY             │
└─────────────────────────────────────────────┘
                     ↓
┌ ─ ─ ─ ─ ─ ─ ─ ─ ─ ─ ─ ─ ─ ─ ─ ─ ─ ─ ─ ─ ─ ┐ ╱─77
   REMOVE THE CLIP FROM THE ASSEMBLY AFTER REFLOW
└ ─ ─ ─ ─ ─ ─ ─ ─ ─ ─ ─ ─ ─ ─ ─ ─ ─ ─ ─ ─ ─ ┘
                     ↓
┌ ─ ─ ─ ─ ─ ─ ─ ─ ─ ─ ─ ─ ─ ─ ─ ─ ─ ─ ─ ─ ─ ┐ ╱─79
                  REUSE CLIP
└ ─ ─ ─ ─ ─ ─ ─ ─ ─ ─ ─ ─ ─ ─ ─ ─ ─ ─ ─ ─ ─ ┘
```

*FIG. 7*

COMPONENT ASSEMBLY FOR SURFACE MOUNTING

FIELD

This invention relates generally to components used with pick and place machines, and more particularly to a method and system of forming an assembly to enable efficient pick and placement of complex components.

BACKGROUND

Complex components or components with complex geometries typically do not have surfaces that are pick and placeable with today's pick and place (P&P) machines. These P&P machines generally use vacuum nozzles to pick and place components and generally fail to accommodate for complex geometries. As a result, many complex components are hand placed and/or hand soldered to circuit boards or other substrates. Even components that are pick and placeable can have geometries that make them unsuitable or unstable for use in a reflow process.

SUMMARY

Embodiments in accordance with the present invention can enable a complex or unbalanced component that would otherwise be unsuitable for a pick and place process to be quite suitable for not only the pick and place process, but also a reflow oven process. As noted above, components having complex geometries typically fail to provide surfaces that are pick and placeable.

In a first embodiment of the present invention, a component assembly used for pick and placing includes a component having a geometry incapable of being picked and placed or having a geometry that is unstable when placed through a reflow oven. It also has a support member or clip having a pick and placeable surface and attached to the component allowing pick and place at the center of gravity, and to form a stable component assembly once attached to the support member.

In a second embodiment of the present invention, a support clip used to form a component assembly suitable for pick and placing the component assembly can include a mass on the support clip to adjust the center of gravity of a component having a geometry incapable of being picked and placed or having a geometry that is unstable when placed through a reflow oven and a flat surface on the support clip suitable for picking and placing using a vacuum nozzle of a pick and place machine. Note, the support clip enables the component assembly to remain stable when the support clip is attached to the component and when placed through the reflow oven.

In a third embodiment, a method of picking and placing a component assembly can include attaching a clip to a component having a geometry incapable of being picked and placed or having a geometry that is unstable when placed on a substrate or placed through a reflow oven when on the substrate, picking the component assembly using a pick and placeable surface of the clip, placing the component assembly on a substrate. As noted above, the component assembly remains stable on the substrate.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "suppressing" can be defined as reducing or removing, either partially or completely.

The term "unstable" denotes a component or assembly that tips or fails to stay substantially stationary during a pick and place process or during a reflow process. The term "stable" denotes a component assembly that remains substantially stationary during a pick and place process or during a reflow process. In other words, the component assembly does not shift or tip after the pick and place process or during the reflow process to the extent that the component or component assembly becomes misregistered or unaligned with respect to a location within a substrate such as a printed circuit board. The term "incapable of being picked and placed" can denote a component that fails to include a surface such as a flat surface that is suitable for being picked up by a nozzle of a pick and place machine or a component that fails to include a surface that enables a stable placement of the component on a substrate during placement. The phrase "modify or adjust a center of gravity" denotes the modification of a component by adding a mass and a geometry (by means of a support clip) that enables a component assembly (that includes the component) to remain stable during the pick and place process or during the reflow process.

Other embodiments, when configured in accordance with the inventive arrangements disclosed herein, can include a system for performing and a machine readable storage for causing a machine to perform the various processes and methods disclosed herein.

BRIEF DESCRIPTION OF THE DRAWINGS

FIG. 7 is a flow chart illustrating a method of picking and placing a component assembly in accordance with an embodiment of the present invention.

DETAILED DESCRIPTION OF THE DRAWINGS

Figure 1:
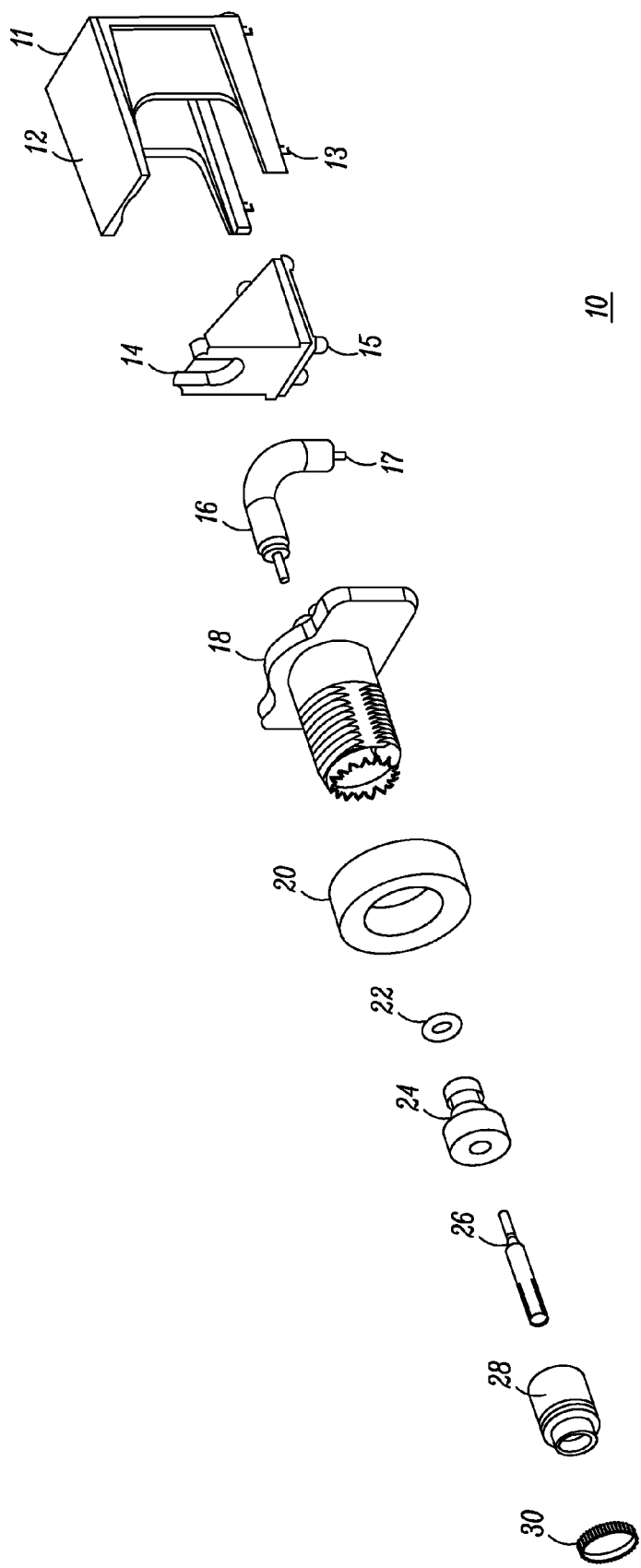
FIG. 1 is an exploded view of a component assembly in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Most surface mount parts require a large flat pick and place surface at the center of gravity and support features for reflow. This limits the geometry to simple shapes that will not tip over. Some applications, such as an RF connector as illustrated in FIGS. 1-5, require complicated geometry that is not uniform. As such, component with such geometries are susceptible to tipping over and may not have a large enough surface area for the pick and place machine. If parts tip even a little bit, particularly during a reflow process, the solder joints may be unacceptable. Because of these limitations, many complex parts are driven to hand soldering or hand placing of parts, which is costly.

Referring to FIG. 1, a component assembly 10 such as an RF connector assembly can include the use of a removable or reusable support for machine placing and reflowing complex geometry parts. Such arrangement can eliminate the need for hand placing/hand soldering them and thereby reduce labor cost and avoid human error in such manufacturing process. The support part as will be further described can prevent tipping and allows a large pick and place surface at the center of gravity. Note, the support can come in the form of a clip that can be removable or reusable, but can also be arranged to be affixed to the component.

In this particular embodiment, the component assembly 10 can include components 14-30 that form an RF Connector and a support clip 11. The RF connector can be an assembly including a main body 18 and bracket 14 for retaining a cable 16. The RF connector can further include a gasket 20, an O-ring 22, an insulator 24, a center contact 26, and another insulator 28 as well as a retainer ring 30. The RF connector components 14-30 in an assembled form would likely tip and forms a complex geometry that is unsuitable for automated pick and placement. Thus, as contemplated herein, the support clip 11 attaches or mates with the RF connector components and in particular with bracket 14. The support clip 11 includes a pick and placeable surface such as the top flat surface 12 as shown. This surface easily allows a vacuum nozzle of a pick and place machine to pick up the component assembly 10 and place it on a substrate (not shown) without concern over dropping the component assembly or causing the component assembly to tip. The clip 11 essentially provides a counterbalance to the RF connector components 14-30 so that the center of balance avoids instability. The clip 11 in this instance also includes long and/or wide base legs to provide additional support and stability.

The support clip 11 is used to form the component assembly 10 and should be suitable for picking and placing the component assembly 10. The support clip can include a mass on the support clip 11 to adjust the center of gravity of a component having a geometry incapable of being picked and placed or having a geometry that is unstable when placed through a reflow oven. The support clip 11 can also include a flat surface suitable for picking and placing using a vacuum nozzle of a pick and place machine. The support clip should also be arranged and constructed to maintain stability when attached to the component and forming the component assembly and further when placed through a reflow oven. The support clip can be made of a hard durable plastic that fails to degrade after being placed through a reflow oven (in many instances having temperatures in the range of 250 degree Celsius). The support clip 11 itself can optionally include protrusions (13 as seen in FIG. 1) for registering and placing the component assembly within a particular location on a substrate. The support clip can be detachable before and after reflow and can be reusable if it does not degrade in any significant manner as a result of the process. The support clip is suited for any component having a geometry incapable of being picked and placed or having a geometry that is unstable when placed on a substrate or placed through a reflow oven when on the substrate. The components are not limited to RF connectors, but can be any component having the geometry and characteristics described above. The RF connector is merely an example.

The component assembly 10 can register with the particular area on a substrate where the component assembly 10 is being placed by using several of its connection points or solder points. In this instance, the center conductor 17 of the cable 16 can serve as a registration point. The bracket 14 forms a part of a ground surface and can include grounding connections 15 that can also be used to register the component assembly to the substrate. Optionally or alternatively, the support clip 11 can also include protrusions 13 that can be used to register the component assembly 10 to the substrate. The support clip 11 can be made of any insulating material such as plastic that can withstand peak reflow temperatures in the range of 250 degrees Celsius.

Generally, a component assembly used for picking and placing the component assembly can include a component having a geometry incapable of being picked and placed or having a geometry that is unstable when placed through a reflow oven. The component assembly can also include a support member such as a detachable clip having a pick and placeable surface (such as a top flat surface) and attached to the component to modify a center of gravity to form a stable component assembly once attached to the support member. The component assembly can further include conductive elements (such as a center conductor of a coaxial cable and at least one ground conductor) used for registration with apertures on a substrate. The support member should be made of materials withstanding reflow oven temperatures such as 250 degrees Celsius. The component assembly can be any number of components, but the example described herein is a coaxial cable connector having a main body, a center conductor, and a bracket that forms a portion of a ground plane and further mates with the support member.

Figure 2:
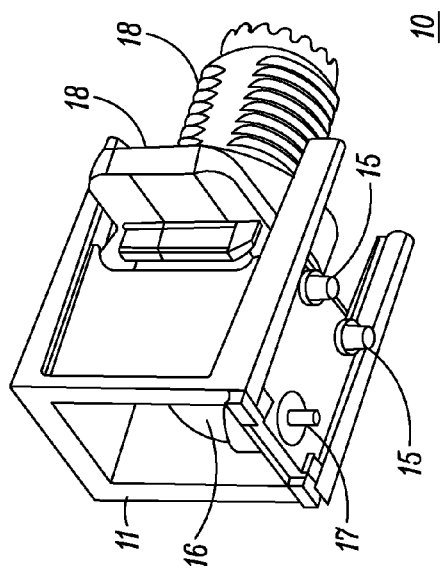
FIG. 2 is a front perspective view of the component assembly of FIG. 1, once assembled.
Figure 3:
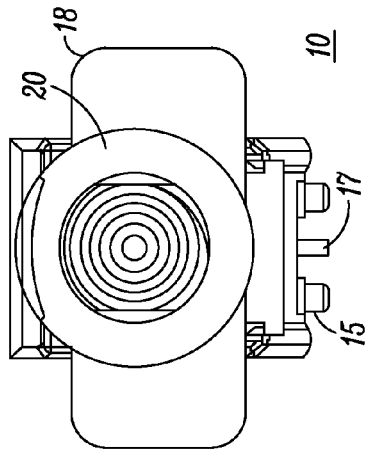
FIG. 3 is a rear perspective view of the component assembly of FIG. 2.
Figure 4:
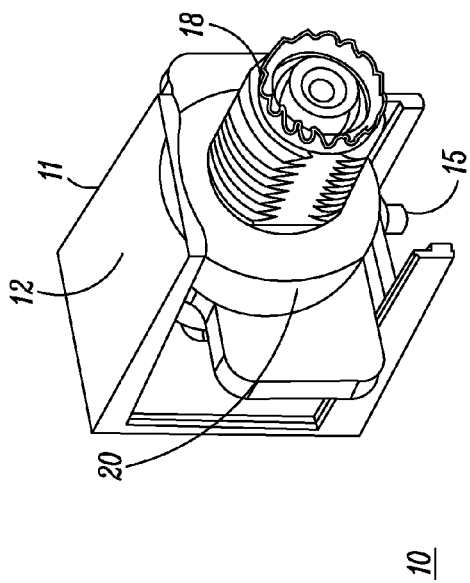
FIG. 4 is a side view of the component assembly of FIG. 2.
Figure 5:
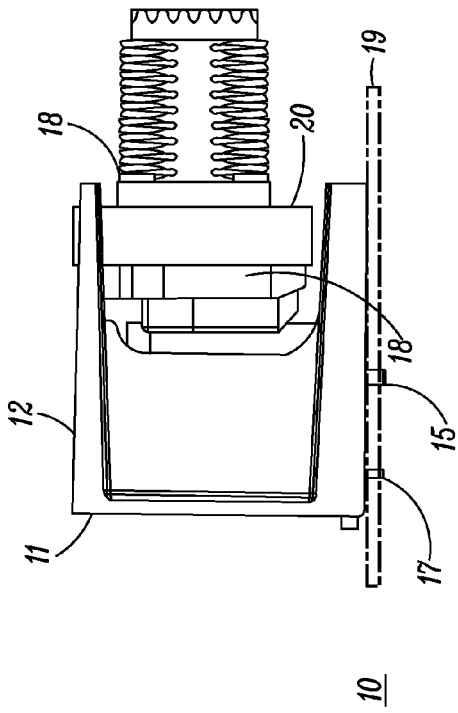
FIG. 5 is a front view of the component assembly of FIG. 2.

Referring to FIGS. 2-5, the component assembly 10 is illustrated in various views in an assembled form. In FIG. 2, a front perspective view clearly demonstrates the flat top surface 12 used for picking and placing. A rear perspective view as illustrated in FIG. 3, clearly shows the connection points used to mount and register the component assembly 10 onto a substrate. In many manufacturing scenarios, solder would likely be screen printed onto specific areas of a substrate such as a printed circuit board and the component assembly 10 would be picked and placed onto the specific designated area of the substrate. The connection points, namely the center conductor 17 of the cable 16 and the ground connection points 15 of the bracket 14 (see FIG. 1) would serve as not only the connection points but registration points to ensure appropriate placement of the component assembly 10 with respect to the substrate and other components that might be placed on the substrate. A side view and front view as illustrated in FIGS. 4 and 5 clearly show the main body 18, the gasket 20 and connection points 17 and 15 as previously discussed. In FIG. 4, the component assembly 10 is shown mounted on a substrate 19 where the connection points 15 and 17 go through holes on the substrate. Alternatively, the connection points 15 and 17 can be surface mounted to the substrate. In either case, the component assembly should be stable and registered and place in an appropriate location with respect to the substrate.

Figure 6:
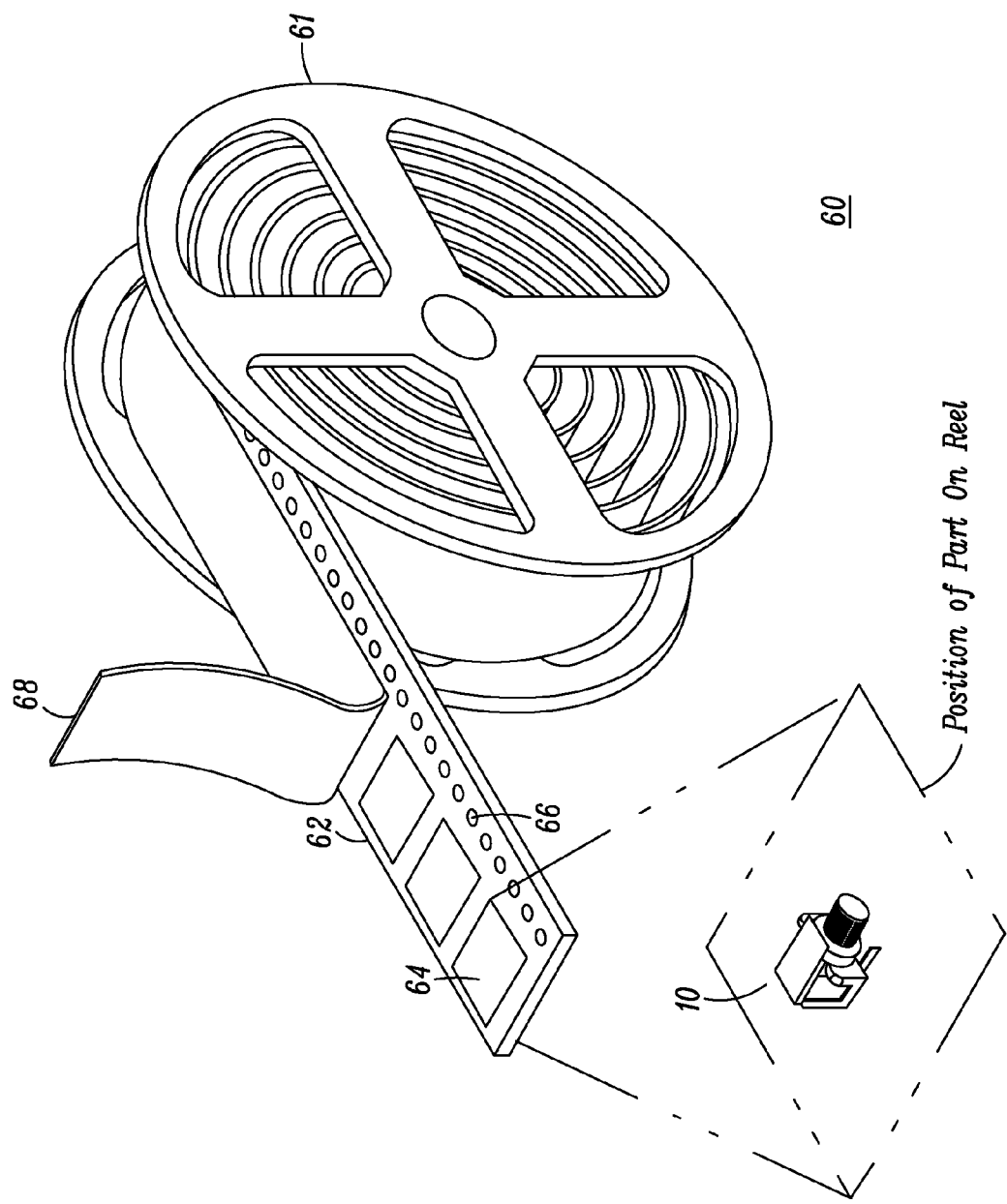
FIG. 6 is an illustration of how the component assembly of FIG. 2 is packaged in a tape reel in accordance with an embodiment of the present invention.

The component assembly 10 can be packaged and dispensed from a tape and reel package 60 as illustrated in FIG. 6. Tape and reel packages are typically used for dispensing flat components for rapid picking and placing by industrial pick and place machines. A tape and reel package 60 can be modified to carry a plurality of component assemblies 10 within each dispensing area or individual cells 64. The tape and reel package 60 can include a tape 62 carried by a reel 61 with a number of dispensing areas or cells 64. The dispensing areas can be covered by a cover strip 68. The component assemblies 10 can progress and be dispensed in a pick and place machine using a series of sprockets or holes 66 to move the tape or film 62 along as needed. The component assemblies 10 can be packaged in the individual cells 64 to avoid damage and/or contamination.

Referring to FIG. 7, a flow chart illustrating a method 70 of picking and placing a component assembly can include the step 72 of attaching or adding a clip to a component having a geometry incapable of being picked and placed or having a geometry that is unstable when placed on a substrate or placed through a reflow oven when on the substrate, picking the component assembly using a pick and placeable surface of the clip at step 74, placing the component assembly on a substrate at step 76, and reflowing the component assembly at step 76. Note that the component assembly remains stable on the substrate after placement and during (and after) reflow. The method can further include the optional step 73 of placing the component assembly on a tape reel that feeds a pick and place machine. As previously noted above, the pick and placeable surface of the clip can be a top flat surface. The method can optionally include the steps 77 and 79 respectively of removing the clip from the component assembly after reflow and reusing the clip after reflowing the component assembly.

In light of the foregoing description, it should be recognized that embodiments in accordance with the present invention can be realized in hardware, software, or a combination of hardware and software if software is use to control or detect physical connections or distances between certain claimed elements that can provide variation in antenna characteristics or performance. It should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A component assembly used for pick and placing, comprising:

a coaxial cable connector having a geometry incapable of being picked and placed and having a geometry that is unstable when placed through a reflow oven; and a support clip having a pick and placeable surface and attached to the coaxial cable connector to modify a center of gravity to form a stable component assembly once attached to the support clip, the support clip for connecting the coaxial cable to a substrate, and the support clip being detachable from the coaxial cable connector before and after reflow.

2. The component assembly of claim 1, further comprising conductive elements used for registration with apertures on the substrate.

3. The component assembly of 2, wherein the conductive elements comprise at least one ground conductor and a center conductor of a coaxial cable.

4. The component assembly of claim 1, wherein the pick and placeable surface is a top flat surface on the support clip that attaches to the component.

5. The component assembly of claim 1, wherein the support clip is made of a material that withstands reflow oven temperatures.

6. The component assembly of claim 1, wherein the coaxial cable connector comprises a main body, a center conductor, and a bracket that forms a portion of a ground plane and further mates with the support clip.

7. The component assembly of claim 1, wherein the support clip modifies the center of gravity by adding a mass and a geometry for stability.

8. The component assembly of claim 7, wherein the support clip is made of a plastic material that fails to degrade after being placed through a reflow oven.

9. The component assembly of claim 7, wherein the support clip includes protrusions for registering and placing the component assembly within a particular location on the substrate.

10. The component assembly of claim 7, wherein the support clip is reusable.

* * * * *

UNITED STATES PATENT AND TRADEMARK OFFICE
CERTIFICATE OF CORRECTION

PATENT NO. : 8,375,571 B2
APPLICATION NO. : 12/234942
DATED : February 19, 2013
INVENTOR(S) : Mtchedlishvili et al.

It is certified that error appears in the above-identified patent and that said Letters Patent is hereby corrected as shown below:

In the Specification

In Column 5, Line 22, delete "software if software is use" and insert -- software, if software is used --, therefor.

In the Claims

In Column 6, Line 11, in Claim 3, delete "2," and insert -- claim 2, --, therefor.

Signed and Sealed this
Fifteenth Day of October, 2013

Teresa Stanek Rea
*Deputy Director of the United States Patent and Trademark Office*